United States Patent
Matsufusa

(10) Patent No.: US 6,191,442 B1
(45) Date of Patent: Feb. 20, 2001

(54) DRAM MEMORY WITH TFT SUPERPOSED ON A TRENCH CAPACITOR

(75) Inventor: Jiro Matsufusa, Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/025,818

(22) Filed: Feb. 19, 1998

(30) Foreign Application Priority Data

Jul. 22, 1997 (JP) .................................................... 9-195636

(51) Int. Cl.[7] .......................... H01L 27/108; H01L 21/336
(52) U.S. Cl. ............................ 257/301; 257/303; 257/305; 438/396; 438/258
(58) Field of Search .................................. 257/301, 303, 257/305; 438/396, 258, 243, 244

(56) References Cited

U.S. PATENT DOCUMENTS

| | | | |
|---|---|---|---|
| 4,649,625 | * | 3/1987 | Lu .............................................. 29/571 |
| 4,988,637 | * | 1/1991 | Dhong et al. ............................. 437/52 |
| 5,008,214 | * | 4/1991 | Redwine .................................... 437/52 |
| 5,075,248 | * | 12/1991 | Yoon et al. ................................ 437/52 |
| 5,426,324 | * | 6/1995 | RajeevKumar ........................ 257/368 |
| 5,512,501 | | 4/1996 | Hidaka et al. . |
| 5,585,285 | | 12/1996 | Tang . |
| 5,804,478 | * | 9/1998 | Nagata et al. ........................... 438/243 |
| 6,008,104 | * | 12/1999 | Schrens .................................... 438/386 |
| 6,025,224 | * | 2/2000 | Gall et al. ............................... 438/243 |

FOREIGN PATENT DOCUMENTS

| | | |
|---|---|---|
| 62-136869 | * 6/1987 | (JP) . |
| 5-283640 | 10/1993 | (JP) . |
| 7-153966 | 6/1995 | (JP) . |

* cited by examiner

*Primary Examiner*—Olik Chaudhuri
*Assistant Examiner*—Shrinivas H. Rao
(74) *Attorney, Agent, or Firm*—Oblon, Spivak, McClelland, Maier & Neustadt, P.C.

(57) ABSTRACT

In order to correspond to high integration with large capacity of a semiconductor device, provided are a structure of the semiconductor device and a method for manufacturing the same in which a horizontal dimension can be reduced in either a memory cell region or a region where a peripheral circuit is to be formed or both the regions. A TFT is superposed on a trench capacitor with an insulation film provided therebetween in a DRAM memory cell region, and a TFT is superposed on a bulk transistor with an insulation film provided therebetween in a region where a peripheral circuit is to be formed. Consequently, elements are arranged three-dimensionally. Thus, a horizontal dimension of a region where each element is to be formed can be reduced.

10 Claims, 13 Drawing Sheets

FIG. 2A    FIG. 2B
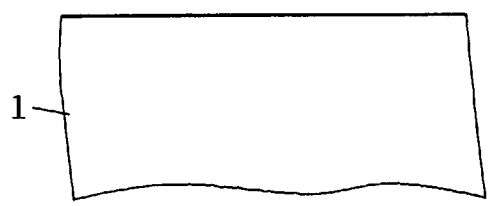
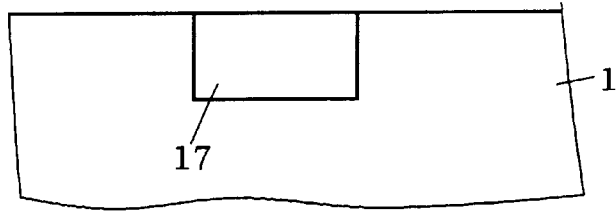
FIG. 3A
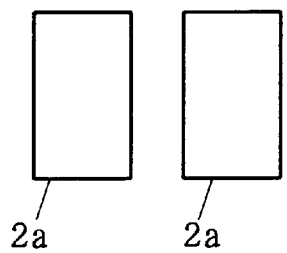
FIG. 3B    FIG. 3C
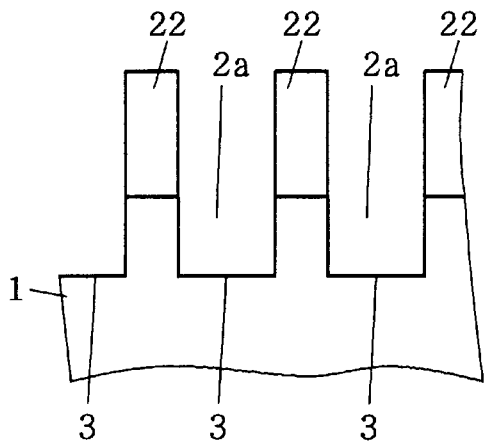
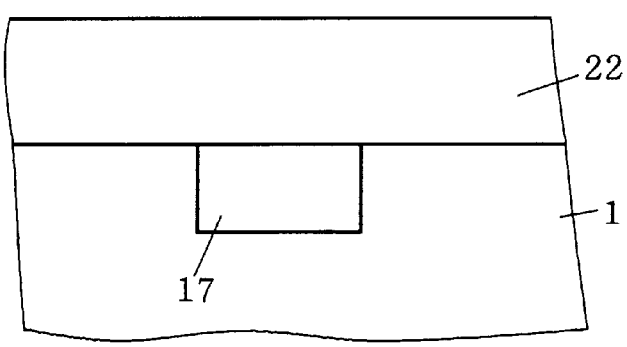

DRAM MEMORY WITH TFT SUPERPOSED ON A TRENCH CAPACITOR

BACKGROUND OF THE INVENTION

1. Field of the Invention

The present invention relates to structures of a memory cell and a peripheral circuit of a DRAM (Dynamic Random Access Memory) of a semiconductor device, and a method for manufacturing the structures.

2. Description of the Background Art

FIG. 15 is a view showing a sectional structure of a semiconductor device according to the prior art. FIG. 15 shows a technique which has been disclosed in Japanese Patent Laying Open Gazette No. 7-153966.

In FIG. 15, the reference numeral 101 denotes a substrate for producing a SOI (Silicon On Insulator) structure, the reference numeral 102 denotes an insulation film provided on the substrate 101, the reference numeral 103 denotes a silicon layer provided on the insulation film 102, the reference numeral 104 denotes an isolation film which is an insulation film formed in a passivation region on the insulation film 102, the reference numeral 105 denotes a gate insulation film provided on a surface of a region corresponding to a channel region of a TFT (thin film transistor) which is built in the silicon layer 103, the reference numeral 106 denotes a gate electrode of the TFT which is formed on the gate insulation film 105, and the reference numerals 107a and 107b denote source/drain regions of the TFT which are built in the silicon layer 103 with the channel region of the TFT interposed therebetween. The reference numeral 108 denotes an insulation film for insulating the gate electrode 106 from a conductive member provided thereon.

Furthermore, a trench 109 is formed in contact with the source/drain region 107a by etching from a surface of the silicon layer 103 to a portion of the substrate 101 which has a predetermined depth. A storage node 110 constituting a trench capacitor is formed in tight contact with an internal wall of the trench 109. An upper end of the storage node 110 and an end of the source/drain region 107a come in contact with each other and are electrically connected to each other. Furthermore, a capacitor insulation film 111 is formed on a surface of the storage node 110, and a cell plate 112 is buried in a surface of the capacitor insulation film 111 with the trench 109 completely filled up. The reference numeral 113 denotes a polypad provided for electrically connecting a bit line 114 provided above the TFT to the source/drain region 107b.

In a memory cell region of the semiconductor device shown in FIG. 15, the trench capacitor is formed adjacently to the TFT, and the storage node 110 constituting the trench capacitor is formed on a surface of the internal wall of the trench 109 and is provided in contact with the source/drain region 107a of the TFT which is built in the silicon layer 103 formed on the substrate 101 with the insulation film 102 provided therebetween. As seen on a plane, the trench capacitor and the TFT are provided adjacently but are not superposed each other. FIG. 16 shows a structure of a peripheral circuit of the semiconductor device according to the prior art.

In a sectional structure illustrated in FIG. 16, a MOS transistor has a source/drain region formed on a substrate (semiconductor substrate) 101 (The MOS transistor will be hereinafter referred to as a bulk transistor 115. The transistor comprises two source/drain regions interposing a channel region therebetween, and a gate electrode formed on the channel region with a gate insulation film provided therebetween.) Only a bit line 114 or an aluminum wiring 116 is provided above the MOS transistor and elements are thinly arranged two-dimensionally in a horizontal direction. The elements are not superposed each other three-dimensionally. As shown in the sectional structure, in the case where five bulk transistors 115 are arranged on the substrate 101, a space of 8.9 $\mu$m is required on the condition that a gate length of each transistor to be formed is 0.35 $\mu$m.

In the structure of the peripheral circuit of the semiconductor device according to the prior art, elements are not provided on an isolation film (a trench isolation, in this case) 104a. An element such as a transistor is formed in a region other than the isolation region 104a, thus constituting the peripheral circuit.

In FIG. 16, the reference numeral 114a denotes a bit line contact and the reference numeral 116a denotes an Al wiring contact.

SUMMARY OF THE INVENTION

A first aspect of the present invention is directed to a semiconductor device comprising a trench capacitor provided in a semiconductor substrate for constituting a memory cell, an insulation film provided on the trench capacitor, and a thin film transistor provided on the insulation film, wherein the thin film transistor is provided in such a manner that at least a part thereof is superposed on the trench capacitor.

A second aspect of the present invention is directed to a semiconductor device comprising a MOS transistor having a source/drain region which is provided in a semiconductor substrate, an isolation region provided in the surface of the semiconductor substrate, a first insulation film provided on at least one of the MOS transistors and the isolation region, and a first thin film transistor provided on the first insulation film, wherein the first thin film transistor is provided in such a manner that at least a part thereof is superposed on at least one of the MOS transistor and the isolation region.

A third aspect of the present invention is directed to a method for manufacturing a semiconductor device, comprising the steps of (a) forming a trench in a surface of a first portion of a semiconductor substrate, forming a dielectric film on an internal wall and a bottom face of the trench and forming a conductive film so as to fill up the trench on which the dielectric film is provided, thereby forming a trench capacitor using the conductive film as a cell plate and the conductive film as a storage node, (b) forming a first insulation film above the trench capacitor, (c) forming a first thin film silicon layer on the first insulation film in such a manner that a part of the first thin film silicon layer is superposed on the trench capacitor, and (d) sequentially forming a first gate insulation film and a first gate electrode on the first thin film silicon layer, and implanting an impurity in the first thin film silicon layer by using the gate electrode as a mask to form a first source/drain region, thereby forming a first thin film transistor.

According to the semiconductor device and the method for manufacturing the semiconductor device of the present invention, the thin film transistor is formed on the trench capacitor constituting the memory cell with the insulation film provided therebetween. Consequently, a horizontal formation dimension of the semiconductor device can be reduced.

For example, in the case where the MOS transistor constitutes a peripheral circuit, the first thin film transistor is formed with the first insulation film provided thereon in such a manner that at least a part of the first thin film transistor is superposed on the MOS transistor. Consequently, the horizontal formation dimension of the semiconductor device can be reduced.

Furthermore, the second thin film transistor is formed on the trench capacitor constituting the memory cell and the first thin film transistor is formed on the MOS transistor constituting the peripheral circuit, for example. Consequently, the horizontal formation dimension of the semiconductor device can be reduced more.

The source/drain region of the thin film transistor and one of the electrodes of the trench capacitor are electrically connected to each other through the contact provided in the insulation film interposed therebetween, or the source/drain region of the MOS transistor and the source/drain region of the first thin film transistor are electrically connected to each other through the first contact provided in the first insulation film interposed therebetween, and the source/drain region of the second thin film transistor and one of the electrodes of the trench capacitor are electrically connected to each other through the second contact provided in the second insulation film interposed therebetween. Consequently, a degree of freedom of arrangement of the thin film transistor can be increased.

The other electrode of the trench capacitor is formed by the semiconductor substrate, and one of the electrodes thereof is provided so as to fill up an inside of the trench through the dielectric film provided on the internal wall and the bottom face of the trench formed on the semiconductor substrate. Therefore, the trench capacitor can be formed so as not to protrude from the surface of the semiconductor substrate. The insulation film is formed on the whole surface of the semiconductor substrate so that the thin film transistor can easily be built in a surface of the insulation film.

For example, in the case where the MOS transistor constitutes the peripheral circuit, it is easy to obtain a structure in which the gate electrode of the MOS transistor and the source/drain region of the first thin film transistor are electrically connected to each other.

The dielectric film and the gate insulation film are formed on the basis of the insulation film formed of the same material at the same step, and the conductive film and the gate electrode are formed on the basis of the conductive film formed of the same material at the same step. Therefore, the number of manufacturing steps can be reduced.

In order to correspond to high integration with large capacity of a semiconductor device, it is an object of the present invention to provide a semiconductor device and a method for manufacturing the semiconductor device in which a horizontal dimension can be reduced in either a memory cell region or a region where a peripheral circuit is to be formed or both the regions.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are views showing a manufacturing flow of the semiconductor device according to the first embodiment of the present invention;

FIGS. 3A to 3C are views showing the manufacturing flow of the semiconductor device according to the first embodiment of the present invention;

DESCRIPTION OF THE PREFERRED EMBODIMENTS

A. First Embodiment

A first embodiment of the present invention will be described below.

A DRAM comprises a peripheral circuit region and a memory cell region. In a process of manufacturing a semiconductor device, the same film can simultaneously be formed in respective regions, and can simultaneously be patterned by using mask patterns having different shapes, thereby forming components of different elements. Accordingly, the memory cell and the peripheral circuit are formed in parallel so that the number of manufacturing steps can advantageously be reduced.

Figure 1A:
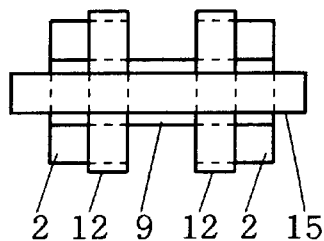
FIGS. 1A to 1C are views showing a semiconductor device according to a first embodiment of the present invention.
Figures 1B, 1C:
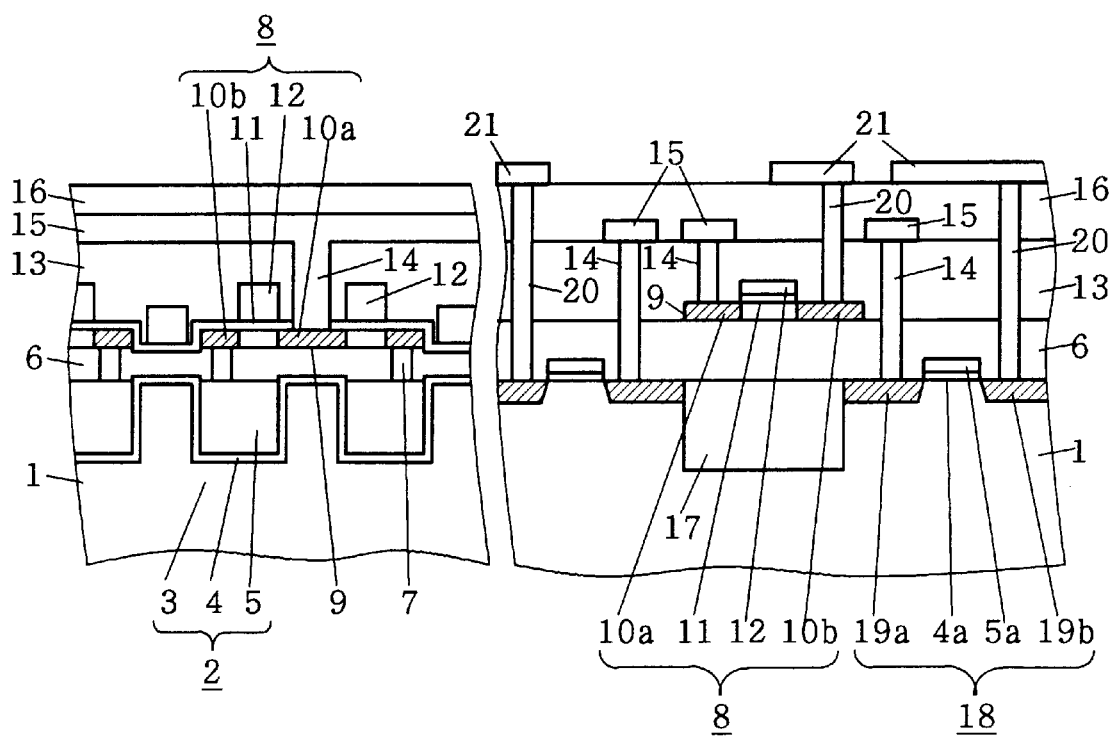

In the first embodiment, a semiconductor device capable of reducing a horizontal dimension thereof will be described below by using an example in which a memory cell and a peripheral circuit are manufactured at the same time A-1. Structure of Device FIGS. 1A to 1C are views showing a semiconductor device according to the present invention. FIG. 1A is a plan view showing a DRAM memory cell structure, FIG. 1B is a sectional view showing a memory cell region, and FIG. 1C is a sectional view showing a peripheral circuit region. FIGS. 1B and 1C have cutting directions which are different from each other. FIG. 1B shows an example taken in a direction of a wiring length of a bit line, and FIG. 1C shows an example taken away in a direction of a wiring width of the bit line.

In FIG. 1B, the reference numeral 1 denotes a substrate made of single crystal silicon and the reference numeral 2 denotes a trench capacitor buried in the substrate 1. The trench capacitor 2 includes a cell plate 3 (generally referred to as a substrate cell plate) of a capacitor utilizing a bottom face and an internal wall of a trench, a dielectric film 4 provided on a surface of the cell plate 3, and a storage node 5 of the capacitor which is formed of a conductive material for filling up the trench.

The reference numeral 6 denotes an insulation film having a predetermined thickness which is provided on a surface of the substrate 1 including the trench capacitor 2, the reference numeral 7 denotes a contact formed in the insulation film 6 for electrically connecting the storage node 5 to one of source/drain regions of a TFT (thin film transistor) 8 which is formed on a surface of the insulation film 6, the reference numeral 9 denotes a silicon layer formed on the surface of the insulation film 6, the reference numerals 10a and 10b denote source/drain regions of the TFT 8 built in the silicon layer 9, the reference numeral 11 denotes a gate insulation film provided on the surface of the insulation film 6 including a surface of the silicon layer 9, and the reference numeral 12 denotes a gate electrode of the TFT 8 which is formed on a channel region interposed between the source/drain regions 10a and 10b with the gate insulation film 11 provided therebetween. The reference numeral 13 denotes an interlayer insulation film provided on the TFT 8, and the reference numeral 14 denotes a contact formed in the interlayer insulation film 13 for electrically connecting the source/drain region 10a of the TFT 8 to a bit line 15 formed on a surface of the interlayer insulation film 13.

While a wiring is not provided above the bit line 15 in a section of FIG. 1B, an upper wiring is formed on a surface of a layer insulation film 16 provided above the bit line 15. In FIGS. 1A and 1C, the same structures as described above have the same reference numerals.

In FIG. 1C, the reference numeral 4a denotes a gate insulation film of a bulk transistor 18 which is formed simultaneously with formation of the dielectric film 4, the reference numeral 5a denotes a gate electrode of a MOS transistor (hereinafter referred to as the bulk transistor 18) which is formed simultaneously with formation of the storage node 5, the reference numeral 17 denotes a trench type isolation region formed in such a manner that two bulk transistors 18 built in the substrate 1 do not electrically influence each other, and the reference numerals 19a and 19b denote source/drain regions formed with a region to act as a channel below the gate electrode 5a provided therebetween, respectively.

The reference numeral 20 denotes a contact formed in the insulation film 6 and the interlayer insulation films 13 and 16 for electrically connecting an upper wiring 21 which is an Al wiring formed on the surface of the layer insulation film 16 to the source/drain region 19b of the bulk transistor 18 (or the source/drain region 10b of the TFT 8). A sectional view of FIG. 1C shows an example in which the source/drain region 19a of the bulk transistor 18 or the source/drain region 10a of the TFT 8 is electrically connected to the bit line 15.

As shown in FIG. 1B, the trench capacitor 2 is completely buried in the substrate 1 in the memory cell region. Therefore, the TFT 8 can be arranged on the surface of the trench capacitor 2 with the insulation film 6 provided therebetween. Accordingly, any arrangement of the TFT 8 can be used if the TFT 8 can be connected to an end of the contact 7. Consequently, the trench capacitor 2 and the TFT 8 can be superposed each other, which cannot be obtained in the prior art. Thus, the horizontal dimension of the semiconductor device can be reduced.

As shown in FIG. 1C, the TFT 8 is superposed on the isolation region 17 or the bulk transistor 18 with the insulation film 6 provided therebetween in the peripheral circuit region. Thus, the elements which should be arranged two-dimensionally with respect to the surface of the substrate 1 in the prior art can be arranged three-dimensionally by longitudinal superposition. Consequently, the horizontal dimension of the semiconductor device itself can be reduced. Thus, higher integration can be obtained.

A-2. Manufacturing Method

A method for manufacturing the semiconductor device shown in FIGS. 1A to 1C will be described below.

First of all, a trench type isolation region 17 is selectively formed in a region constituting a peripheral circuit as shown in FIG. 2B. A section of the isolation region 17 has a horizontal dimension of about 0.2 to 2.0 μm. At this time, a memory cell region shown in FIG. 2A is not processed.

As shown in FIGS. 3A to 3C, an etching mask 22 is wholly formed. The etching mask 22 formed on a substrate 1 of a memory cell region is subjected to patterning. By using the patterned etching mask 22, etching is performed to form a trench 2a for forming a trench capacitor 2 having a depth of about 500 to 5000 Å as shown in FIGS. 3A and 3B. Furthermore, an impurity is implanted in an internal wall and a bottom face of the trench 2a, thereby forming a cell plate 3. The etching mask 22 is removed.

Figure 4A:
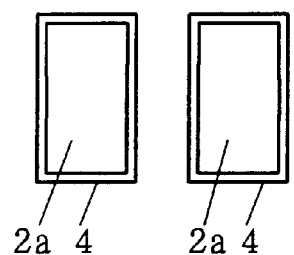
FIGS. 4A to 4C are views showing the manufacturing flow of the semiconductor device according to the first embodiment of the present invention.
Figure 4B:
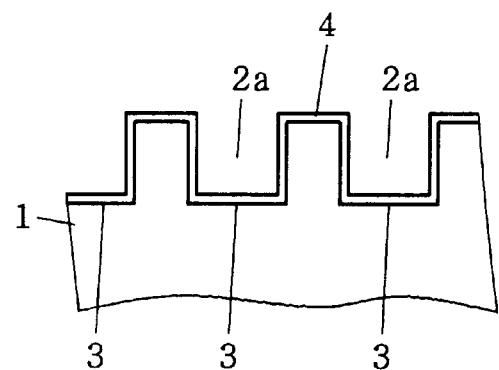
Figure 4C:
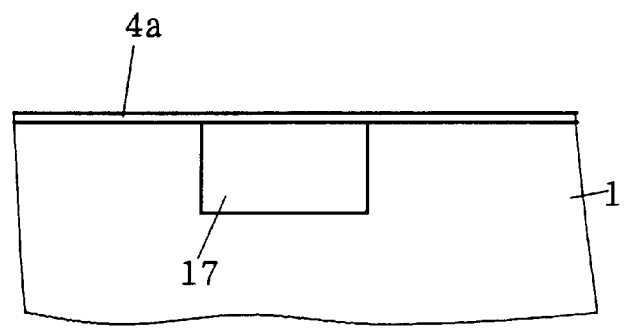

Then, a silicon nitride film is provided in a thickness of about 20 to 100 Å by a CVD method over a whole surface of the substrate 1 including the internal wall and bottom face of the trench 2a as shown in FIGS. 4A to 4C. The silicon nitride film acts as a dielectric film 4 in the memory cell region and as a gate insulation film 4a of a bulk transistor 18 in a peripheral circuit region.

Figure 5A:
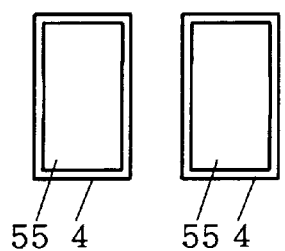
FIGS. 5A to 5C are views showing the manufacturing flow of the semiconductor device according to the first embodiment of the present invention.
Figure 5B:
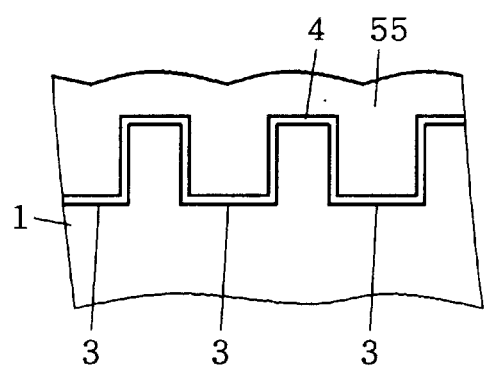
Figure 5C:
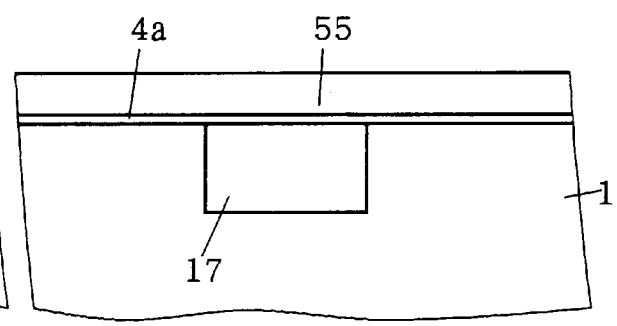

Thereafter, a polysilicon film 55 is provided over a whole surface by the CVD method as shown in FIGS. 5A to 5C. If a horizontal opening shape of the trench 2a formed in the memory cell region is about 0.36×0.96 μm, the polysilicon film 55 is provided in a thickness of about 2000 to 5000 Å so that an inside of the trench 2a can completely be filled up. A portion of the polysilicon film 55 which is buried in the trench 2a constitutes a storage node 5. A portion of the polysilicon film 55 which is provided on the peripheral circuit constitutes a gate electrode 5a of the bulk transistor 18.

Figure 6A:
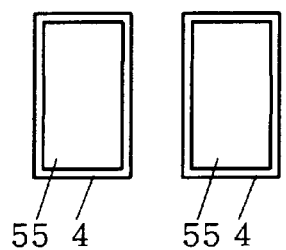
FIGS. 6A to 6C are views showing the manufacturing flow of the semiconductor device according to the first embodiment of the present invention.
Figure 6B:
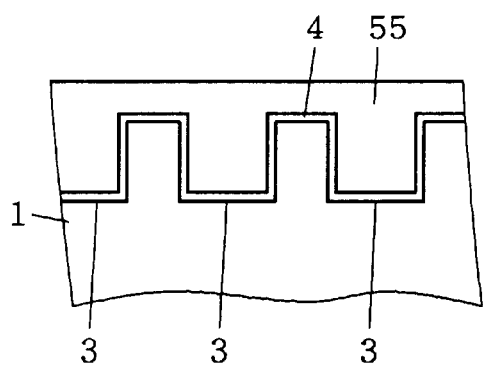
Figure 6C:
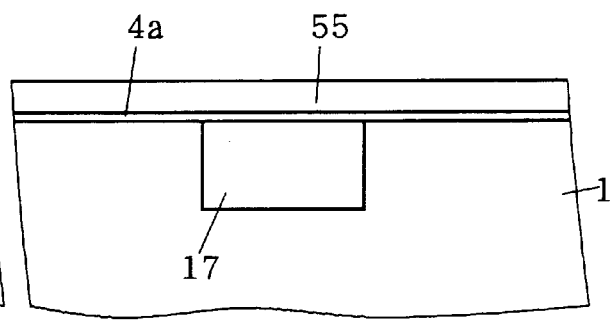

Next, the polysilicon film 55 is subjected to etching by a CMP (Chemical Mechanical Polishing) method as shown in FIGS. 6A to 6C. Etch-back is performed up to a thickness (500 to 2000 Å) of the gate electrode 5a which is necessary for a structure of the bulk transistor 18 to be formed in the peripheral circuit.

Figure 7A:
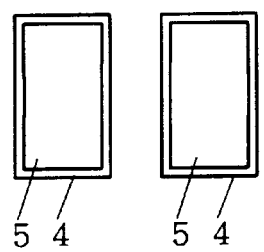
FIGS. 7A to 7C are views showing the manufacturing flow of the semiconductor device according to the first embodiment of the present invention.
Figure 7B:
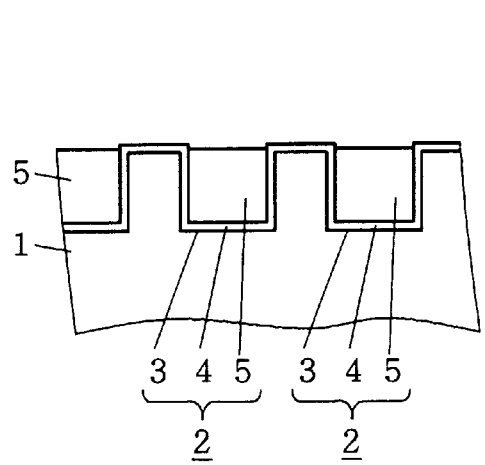
Figure 7C:
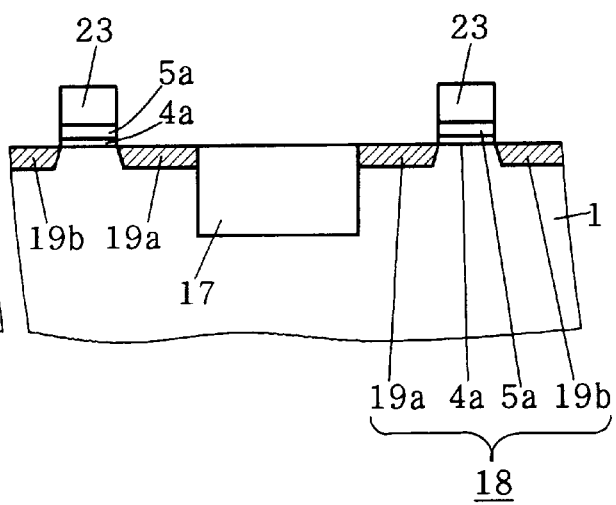

Subsequently, an etching mask 23 is wholly formed. As shown in FIG. 7C, the etching mask 23 having a shape corresponding to the gate electrode 5a of the bulk transistor 18 is subjected to patterning in the peripheral circuit region, and the polysilicon film 55 is subjected to anisotropic etching. As shown in FIG. 7B, the polysilicon film 55 is subjected to the anisotropic etching without an etching mask formed on the polysilicon film 55 positioned in the memory cell region. On the other hand, the gate electrode 5a is obtained by existence of the etching mask 23 in the peripheral circuit region as shown in FIG. 7C. In this case, the polysilicon film 55 is subjected to etch-back until the surface of the substrate 1 is reached, and the adjacent storage nodes 5 constituting the trench capacitors 2 are buried in respective trenches. Then, the etching mask 23 is removed, and an impurity is selectively implanted in the peripheral circuit region. Consequently, source/drain regions 19a and 19b are formed.

For simplicity of explanation of a manufacturing process, description will not be given to formation of a sidewall bonded to a sidewall of the gate electrode 5a of the bulk transistor 18 and that of the source/drain regions 19a and 19b having an LDD structure with the use of the sidewall as an impurity implantation mask. The gate insulation film 4a formed in the peripheral circuit region is subjected to patterning simultaneously with the etching performed during the formation of the sidewall or by sequentially performing etching using the formed sidewall as an etching mask, for example. Furthermore, the gate insulation film 4a may remain in almost the whole surface of the peripheral circuit region, and a method for opening only a region necessary for electrical connection to the source/drain regions 19a and 19b can also be used.

Figure 8A:
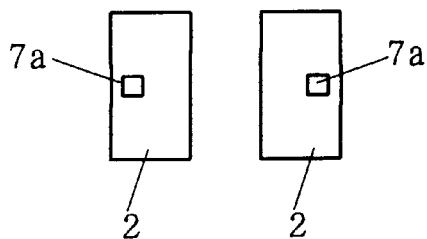
FIGS. 8A to 8C are views showing the manufacturing flow of the semiconductor device according to the first embodiment of the present invention.
Figure 8B:
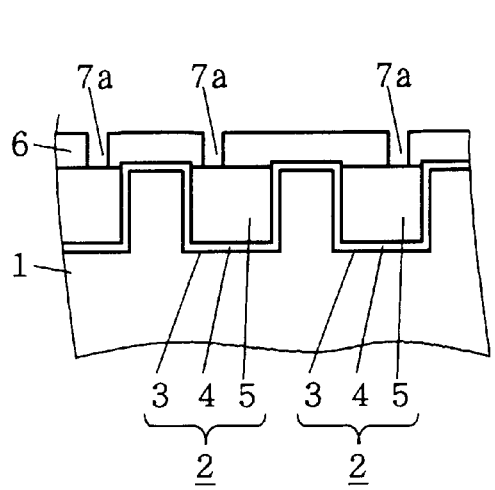
Figure 8C:
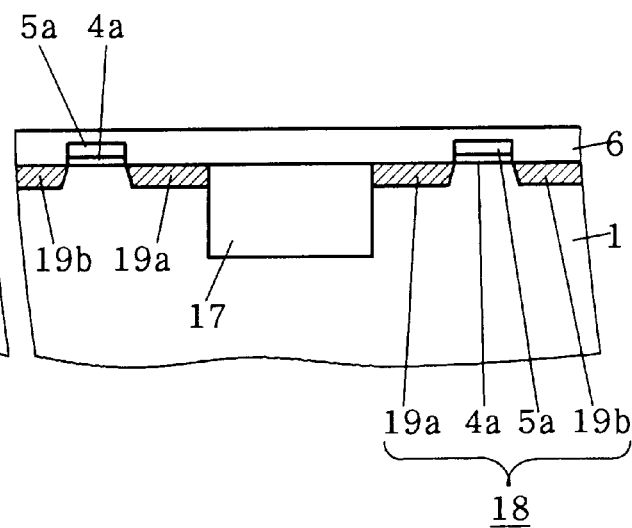

As shown in FIGS. 8A to 8C, an insulation film 6 is formed in a predetermined thickness over a whole surface of the substrate 1. Furthermore, a contact hole 7a for selectively exposing a surface of the storage node 5 is opened as shown in FIG. 8B. At the same time, it is possible to form a contact hole for partially exposing the gate electrode 5a or the source/drain regions 19a and 19b of the bulk transistor 18 constituting the peripheral circuit, which is not shown in a section of FIG. 8C.

Figure 9A:
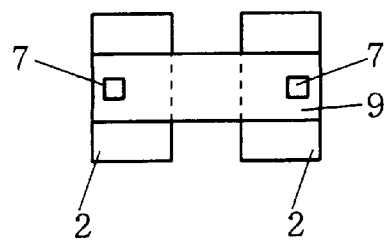
FIGS. 9A to 9C are views showing the manufacturing flow of the semiconductor device according to the first embodiment of the present invention.
Figure 9B:
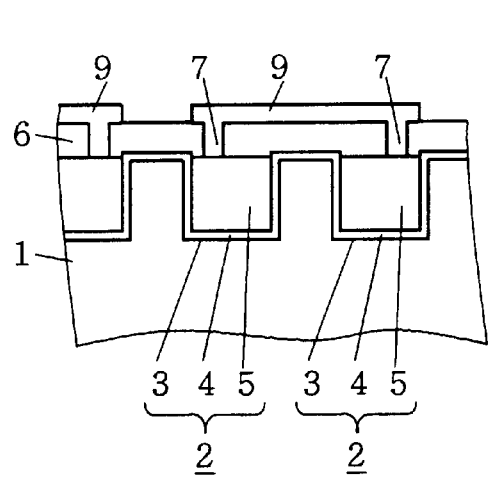
Figure 9C:
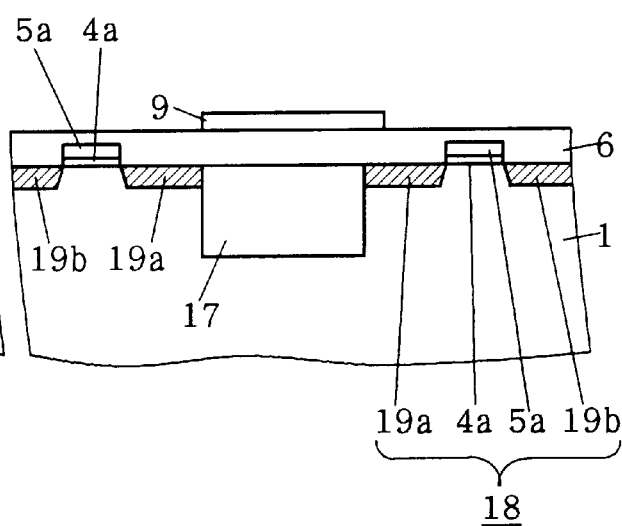

Then, a polysilicon film is formed in a thickness of about 100 to 1000 Å over the whole surface by a CVD method. By the formation of the polysilicon film, a contact 7 is formed in the contact hole 7a as shown in FIG. 9A. As shown in FIGS. 9A and 9B, the polysilicon film is subjected to patterning so as to constitute a silicon layer 9 in which source/drain regions 10a and 10b and a channel region of a TFT 8 are to be formed. As shown in FIG. 9C, the silicon layer 9 is simultaneously formed also in the peripheral circuit region.

The silicon layer 9 is formed in such a manner that at least a part thereof is superposed on the trench capacitor 2 in the memory cell region, and is superposed on the bulk transistor 18 or the isolation region 17 in the peripheral circuit region.

It is needless to say that if a contact hole is opened at a previous step, an opening is filled up by the formation of the polysilicon film, thereby forming a contact in the peripheral circuit region as well as the memory cell region.

Figure 10A:
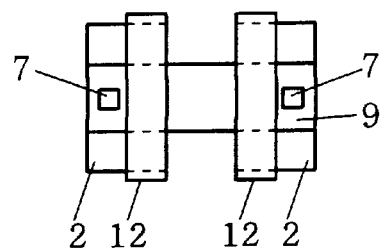
FIGS. 10A to 10C are views showing the manufacturing flow of the semiconductor device according to the first embodiment of the present invention.
Figure 10B:
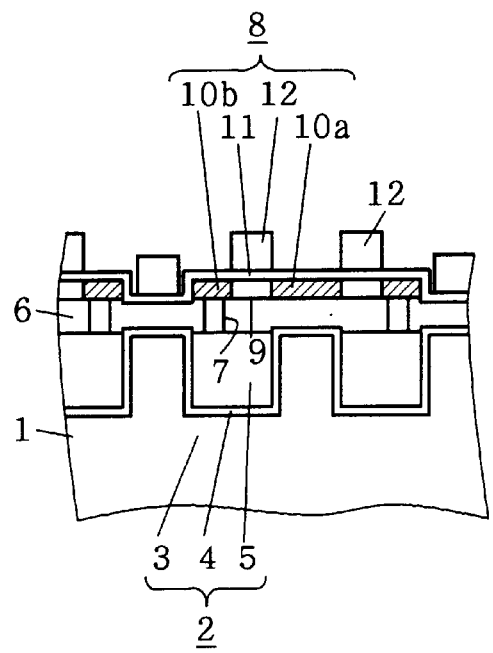
Figure 10C:
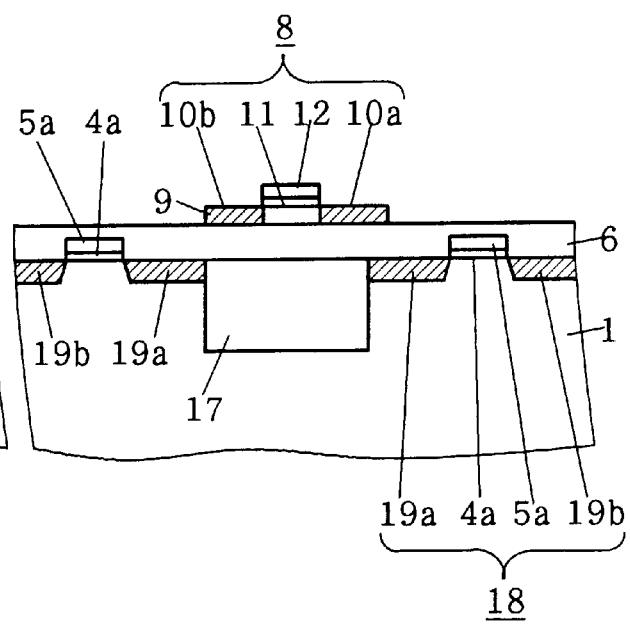

As shown in FIGS. 10A to 10C, a silicon oxide film is formed by the CVD method or a surface of the silicon layer 9 is oxidized so that a gate insulation film 11 is obtained.

Then, a polysilicon film is provided in a thickness of about 100 to 1000 Å on a surface of the gate insulation film 11 by the CVD method. Thereafter, the polysilicon film is subjected to patterning. Consequently, a gate electrode 12 constituting the TFT 8 is formed in the memory cell region and the peripheral circuit region. Next, an impurity is selectively implanted in the silicon layer 9 to form the source/drain regions 10a and 10b. As shown in FIG. 10B, the source/drain region 10b is electrically connected to the trench capacitor 2 through the contact 7 in the memory cell region.

Figure 11A:
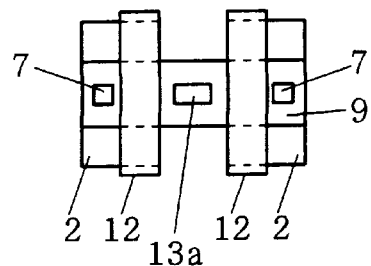
FIGS. 11A to 11C are views showing the manufacturing flow of the semiconductor device according to the first embodiment of the present invention.
Figures 11B, 11C:
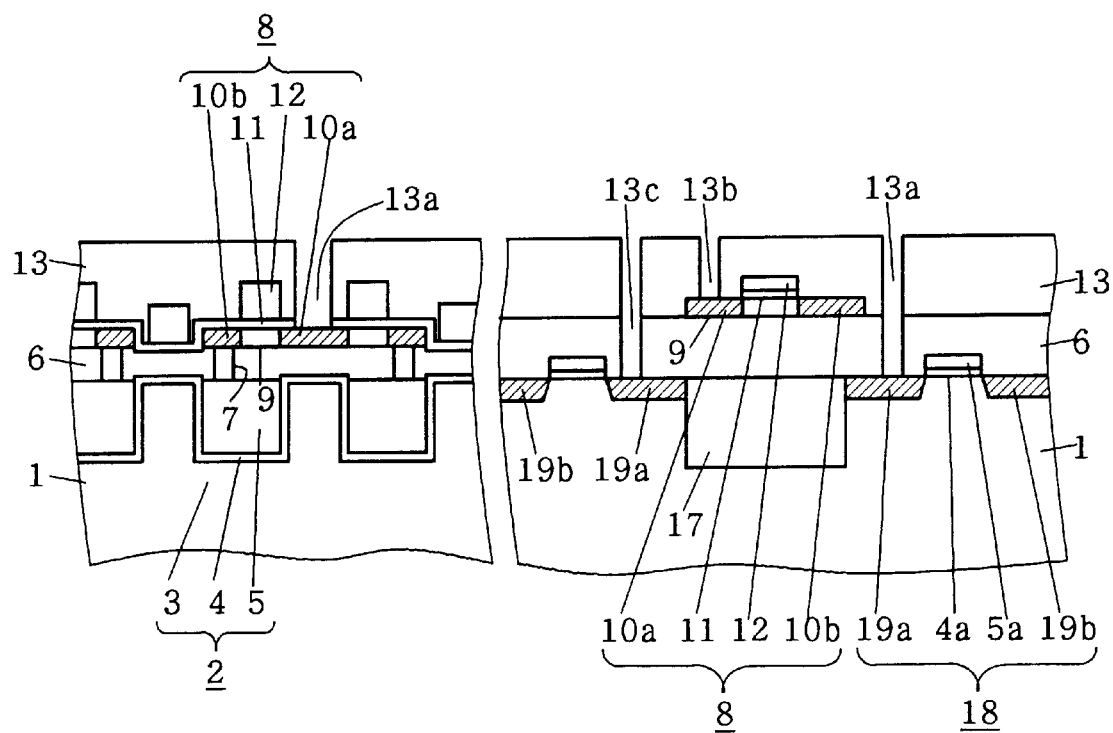

Subsequently, a interlayer insulation film 13 is formed on the surface of the substrate 1 by the CVD method as shown in FIGS. 11A to 11C. Furthermore, the interlayer insulation film 13 is subjected to anisotropic etching. A contact hole 13a for exposing the source/drain region 10a of the TFT 8 is formed in the memory cell region as shown in FIGS. 11A and 11B, and a contact hole 13b for exposing the source/drain region 10b of the TFT 8 and a contact hole 13c for exposing the source/drain region 19a of the bulk transistor 18 are formed in the peripheral circuit region as shown in FIG. 11C.

Next, a polysilicon film is formed on the surface of the substrate 1 by the CVD method. Consequently, the contact holes 13a to 13c are filled up with a conductive material so that a contact 14 is formed. In addition, a polysilicon film formed on a surface of the interlayer insulation film 13 is subjected to patterning so that only a region to act as a bit line 15 is caused to selectively remain.

Then, a layer insulation film 16 is provided on the surface of the substrate 1 to form a contact 20 which abuts on the source/drain region 10b constituting the TFT 8 and the source/drain region 19b constituting the bulk transistor 18. In addition, an upper wiring 21 which comes in contact with the contact 20 is formed on the interlayer insulation film 16. Consequently, a semiconductor device having a sectional structure shown in FIGS. 1B and 1C can be obtained.

A-3. Characteristic Function and Effect

In the semiconductor device according to the first embodiment, the TFT 8 is superposed on the trench capacitor 2 so that a horizontal dimension of a memory cell can be reduced in the memory cell region. In the peripheral circuit region, the bulk transistor 18 or the isolation region 17 and the TFT 8 are superposed each other and the TFT 8 is superposed on the isolation region 17 in which elements have not been formed in the prior art. Consequently, the horizontal dimension can be reduced.

A-3-1. Structure of Peripheral Circuit

Figure 12:
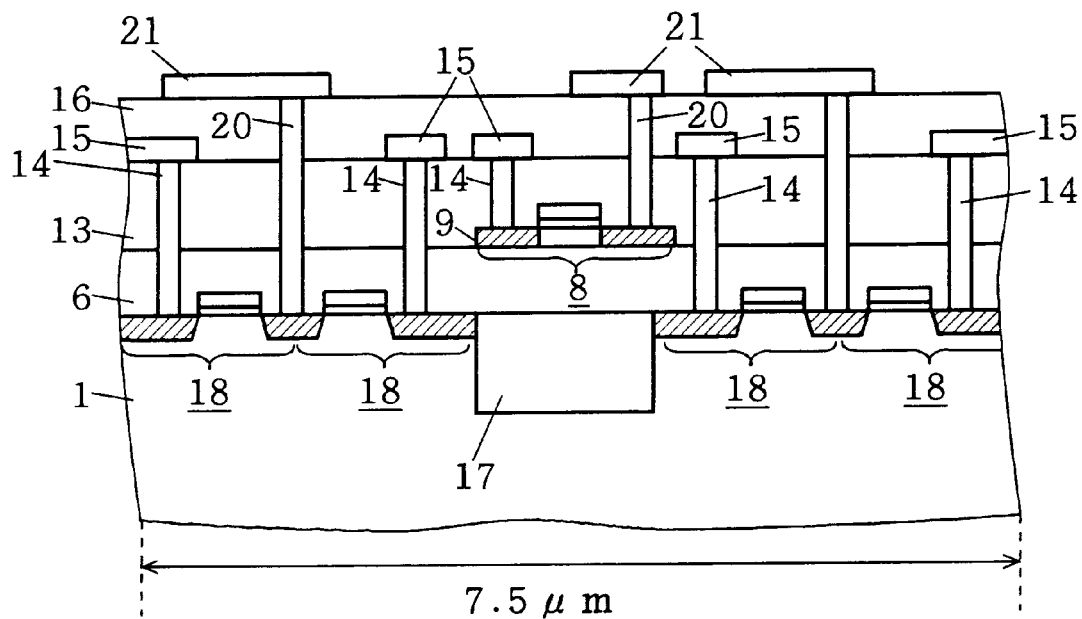
FIG. 12 is a view showing the semiconductor device according to the first embodiment of the present invention.

More specifically, FIG. 12 is a sectional view showing an example of a peripheral circuit according to the present invention. A peripheral circuit diagram of FIG. 12 corresponds to FIG. 16 showing the prior art, and shows the same circuit structure and element sizes as in FIG. 16 (a transistor has a gate length of 0.35 µm).

Figure 16:
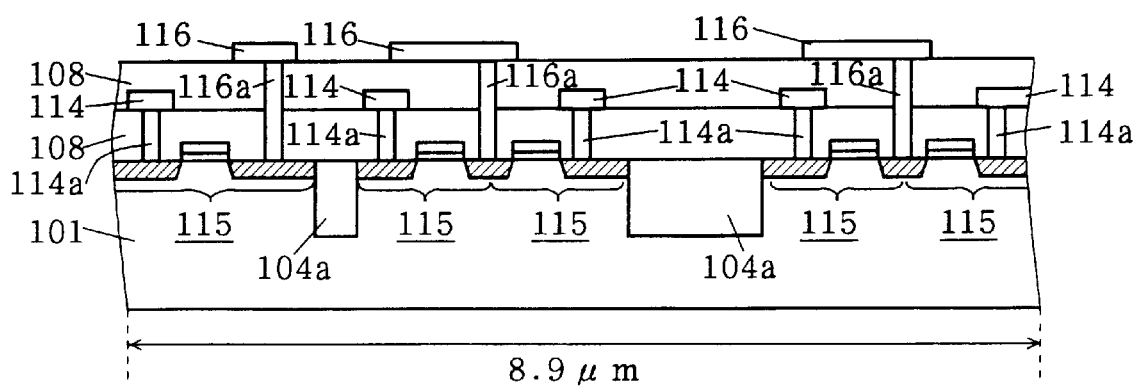
FIG. 16 is a view for explaining the prior art.

While a horizontal dimension of a peripheral circuit according to the prior art shown in FIG. 16 is 8.9 µm, that of the peripheral circuit according to the present invention shown in FIG. 12 can be set to 7.5 µm which is about 83% of that of the prior art. It is apparent that a semiconductor device having higher integration can be obtained by using the present invention.

While the semiconductor device according to the first embodiment has been shown as an example of the present invention in FIGS. 1A to 12, it is needless to say that the cell plate 3 of the trench capacitor 2 cannot be formed by a substrate cell plate but by a polysilicon film or the like, a component of the element can be replaced with other components having the same properties and the dimension of the element can be varied to form the semiconductor device.

B. Second Embodiment

A second embodiment of the present invention will be described below.

In the first embodiment, the bit line 15 formed in the peripheral circuit of the semiconductor device is provided on the source/drain region 19a constituting the bulk transistor 18 or the source/drain region 10a constituting the TFT 8 with the contact 14 provided therebetween. For example, the bit lines 15 are electrically connected to each other in a region which is not shown in the sectional view of FIG. 1C.

A different connecting method between the source/drain region 19a of the bulk transistor 18 and the source/drain region 10a of the TFT 8 will be described in the second embodiment.

B-1. Structure of Device

Figure 13:
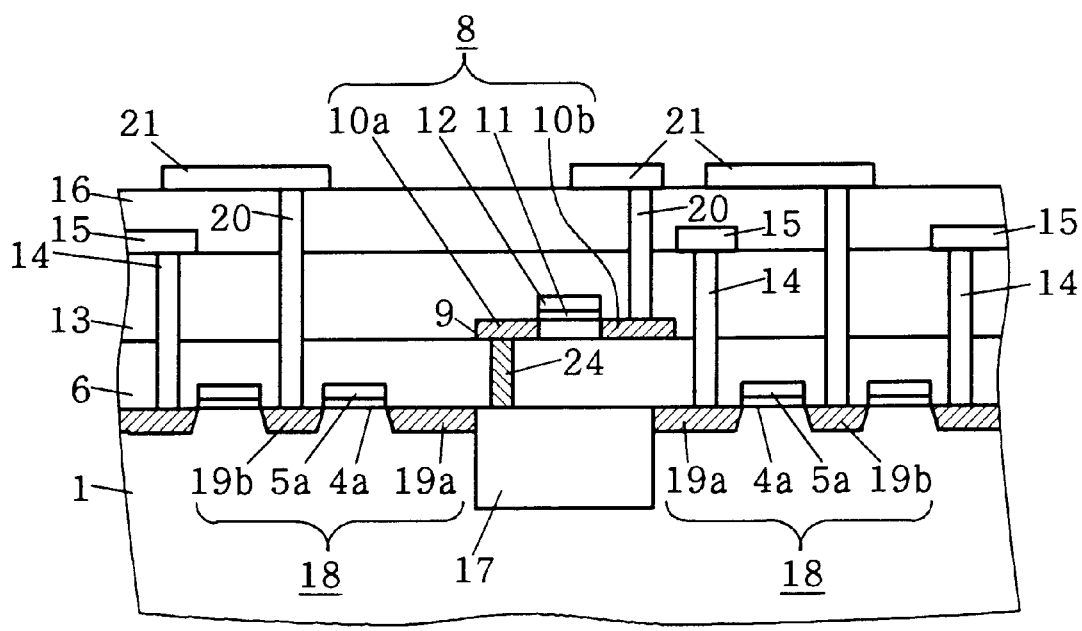
FIG. 13 is a view showing a semiconductor device according to a second embodiment of the present invention.

FIG. 13 is a sectional view constituting a peripheral circuit of a semiconductor device according to the present invention. A circuit structure of FIG. 13 is equivalent to that of FIG. 12.

In the semiconductor device according to the second embodiment, the bulk transistor 18 and the TFT 8 are superposed each other and the respective source/drain regions 19a and 10a are longitudinally provided as shown in FIG. 13. A connecting section 24 made of a conductive material is formed from an upper face of the source/drain region 19a of the bulk transistor 18 to a bottom face of the source/drain region 10a of the TFT 8 so that electrical connection can be obtained.

B-2. Characteristic Function and Effect

Thus, the TFT 8 and the bulk transistor 18 are directly connected to each other so that a wiring length necessary for the electrical connection can be reduced. Consequently, a wiring resistance can be reduced. Furthermore, a horizontal dimension, in particular, in a peripheral circuit region of the semiconductor device can be reduced more. Thus, the semiconductor device having high integration can be obtained.

C. Third Embodiment

Next, a third embodiment will be described.

In the first and second embodiments, the whole structures of the memory cell region and peripheral circuit region of the semiconductor device have been described.

In the third embodiment, connection of a source/drain region 10a of a TFT 8 and a gate electrode 5a of a bulk transistor 18 which are components of a peripheral circuit will be described below.

With the structure of the peripheral circuit of the semiconductor device according to the prior art, switching transistors are not superposed on each other, for example. For this reason, in the case where a source/drain region of a first transistor should be connected to a gate electrode of a second transistor, it is necessary to form a first connecting section which comes in contact with the source/drain region of the first transistor and extends upward, a second connecting section which comes in contact with the gate electrode of the second transistor and extends upward, and a wiring for connecting the first and second connecting sections. Accordingly, a region necessary for the connection is large and a wiring length necessary for the connection is also great.

C-1. Structure of Device

Figure 14A:
FIGS. 14A to 14C are views showing a semiconductor device according to a third embodiment of the present invention.
Figure 14B:
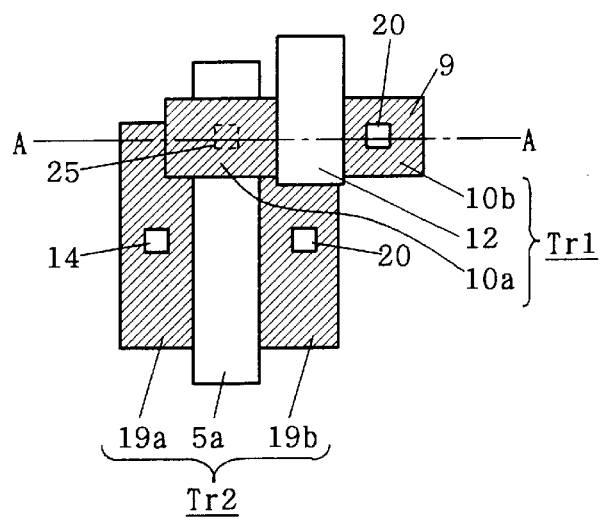
Figure 14C:
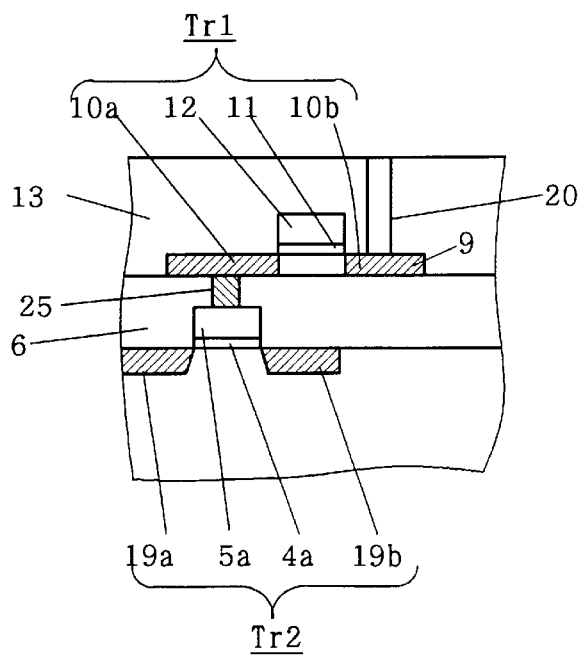
Figure 15:
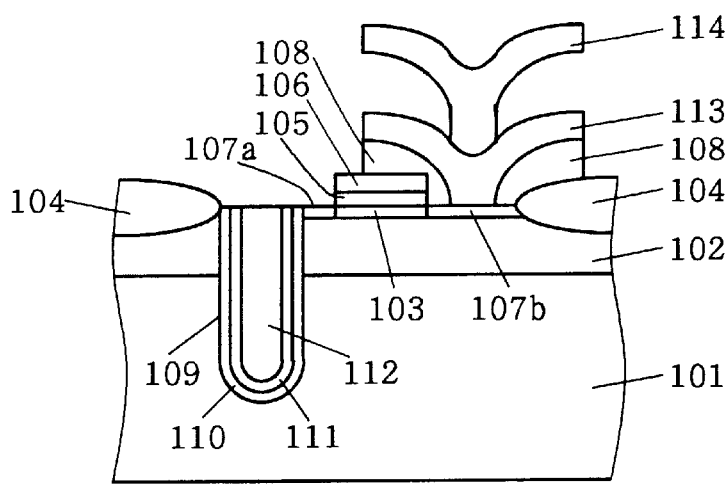
FIG. 15 is a view for explaining the prior art.

FIGS. 14A to 14C show the third embodiment of the present invention. FIG. 14A shows a state in which a source/drain region of a TFT (Tr1) and a gate electrode of a bulk transistor (Tr2) which constitute the peripheral circuit of the semiconductor device are connected to each other.

FIG. 14B is a plan view showing the circuit of FIG. 14A. Since the structure which has been described in the first embodiment is used as an example, the same structures have the same reference numerals as in the first embodiment. A source/drain region 10a of the Tr1 and a gate electrode 5a of the Tr2 are connected to each other through a connecting section 25.

In the same manner as in the first and second embodiments, the Tr1 acting as the TFT and the Tr2 acting as the bulk transistor which constitute the peripheral circuit are partially superposed each other. A portion surrounding the Tr2 acting as the bulk transistor is an isolation region. Therefore, the Tr1 acting as the TFT is also superposed on the isolation region.

FIG. 14C is a sectional view taken along the line A—A shown in FIG. 14B.

In FIG. 14C, the structure which has been described in the first embodiment is used as an example. Therefore, the same structures have the same reference numerals as in the first embodiment.

C-2. Characteristic Function and Effect

The gate electrode 5a of the Tr2 acting as the bulk transistor and the source/drain region 10a of the Tr1 acting as the TFT are connected to each other through only the connecting section 25 formed in an insulation film 6. A vertical dimension of the connecting section 25 is equal to a value obtained by subtracting thicknesses of the gate electrode 5a and a gate insulation film 4a from a thickness of the insulation film 6. A wiring length necessary for the connection is small. Therefore, a wiring resistance can be reduced. It is apparent that a semiconductor device having excellent electrical characteristics can be obtained. In addition, an area occupied by a wiring and a contact for the connection can be reduced. Thus, a semiconductor device having higher integration can be obtained.

In the same manner as in the first and second embodiments, the Tr1 acting as the TFT and the Tr2 acting as the bulk transistor which constitute the peripheral circuit are partially superposed each other as shown in FIG. 14 (B). In the peripheral circuit, elements are formed three-dimensionally. Consequently, a horizontal dimension of the semiconductor device can be reduced.

While the invention has been described in detail, the foregoing description is in all aspects illustrative and not restrictive. It is understood that numerous other modifications and variations can be devised without departing from the scope of the invention.

I claim:

1. A semiconductor device comprising:

a trench capacitor provided in a semiconductor substrate for constituting a memory cell, the trench capacitor having a plurality of electrodes, one of the electrodes being a storage node;

an insulation film provided on said trench capacitor; and a thin film transistor provided on said insulation film, wherein said thin film transistor is provided in such a manner that at least a part thereof is superposed on said trench capacitor, said thin film transistor having a source/drain region electrically connected to the storage node through a contact provided solely in said insulation film interposed therebetween.

2. The semiconductor device according to claim 1, wherein the source/drain region of said thin film transistor is superposed on said trench capacitor.

3. The semiconductor device according to claim 2, wherein another one of the electrodes of said trench capacitor is an internal wall and a bottom face of a trench provided in said semiconductor substrate, a dielectric film of said trench capacitor is provided on said internal wall and said bottom face of said trench, and said one of electrodes is provided so as to fill up said trench on which said dielectric film is provided.

4. A semiconductor device comprising:

a memory cell region; and a peripheral circuit region coupled to the memory cell region, the peripheral circuit region comprising, a MOS transistor having a gate electrode and a source/drain region, said source/drain region being provided in a semiconductor substrate, an isolation region provided in said semiconductor substrate, a first insulation film provided on at least one of said MOS transistor and said isolation region, and a first thin film transistor provided on said first insulation film, wherein said first thin film transistor is provided in such a manner that at least a part thereof is superposed on at least one of said MOS transistor and said isolation region.

5. The semiconductor device according to claim 4, wherein the gate electrode of said MOS transistor and the source/drain region of said first thin film transistor are superposed on each other, and said gate electrode of said MOS transistor and said source/drain region of said first thin film transistor are electrically connected to each other through a first contact provided in said first insulation film interposed therebetween.

6. The semiconductor device according to claim 4, further comprising:

a trench capacitor provided in said semiconductor substrate within the memory cell region;

a second insulation film provided on said trench capacitor; and a second thin film transistor provided on said second insulation film, wherein said second thin film transistor is provided in such a manner that at least a part thereof is superposed on said trench capacitor.

7. The semiconductor device according to claim 6, wherein said source/drain region of said MOS transistor and a source/drain region of said first thin film transistor are superposed on each other, a source/drain region of said second thin film transistor and one of electrodes of said trench capacitor are superposed on each other, said source/drain region of said MOS transistor and said source/drain region of said first thin film transistor are electrically connected to each other through a first contact provided in said first insulation film interposed therebetween, and said source/drain region of said second thin film transistor and said one of electrodes of said trench capacitor are electrically connected to each other through a second contact provided in said second insulation film interposed therebetween.

8. The semiconductor device according to claim 7, wherein said one of electrodes of said trench capacitor and a gate electrode of said MOS transistor are formed of the same material.

9. The semiconductor device according to claim 7, wherein a dielectric film of said trench capacitor and a gate insulation film of said MOS transistor are formed of the same material.

10. The semiconductor device according to claim 9, wherein the other electrode of said trench capacitor is an internal wall and a bottom face of a trench provided on said semiconductor substrate, said dielectric film of said trench capacitor is provided on said internal wall and bottom face of said trench, and said one of electrodes of said trench capacitor is provided so as to fill up said trench on which said dielectric film is provided.

* * * * *